(12) United States Patent
Parkhe

(10) Patent No.: US 11,676,849 B2
(45) Date of Patent: Jun. 13, 2023

(54) SUBSTRATE CARRIER

(71) Applicant: APPLIED MATERIALS, INC., Santa Clara, CA (US)

(72) Inventor: Vijay D. Parkhe, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 636 days.

(21) Appl. No.: 16/675,033

(22) Filed: Nov. 5, 2019

(65) Prior Publication Data

US 2020/0066571 A1 Feb. 27, 2020

Related U.S. Application Data

(62) Division of application No. 15/643,855, filed on Jul. 7, 2017, now Pat. No. 10,497,605.

(60) Provisional application No. 62/360,331, filed on Jul. 9, 2016.

(51) Int. Cl.
*H01L 21/687* (2006.01)

(52) U.S. Cl.
CPC .. *H01L 21/68728* (2013.01); *H01L 21/68721* (2013.01); *H01L 21/68735* (2013.01); *H01L 21/68757* (2013.01); *H01L 21/68764* (2013.01); *H01L 21/68771* (2013.01); *H01L 21/68785* (2013.01)

(58) Field of Classification Search
CPC ......... H01L 21/68735; H01L 21/68771; H01L 21/68785; H01L 21/68721; H01L 21/68764; H01L 21/68728; H01L 21/68757; H01L 21/67346; H01L 21/6773; C23C 16/4585; C23C 16/4584; C30B 25/12

See application file for complete search history.

(56) References Cited

U.S. PATENT DOCUMENTS

| | | | |
|---|---|---|---|
| 5,195,729 A | 3/1993 | Thomas | |
| 5,700,297 A | 12/1997 | Vollaro | |
| 6,343,784 B1 | 2/2002 | Jourde | |
| 6,379,235 B1 | 4/2002 | Hazlley | |
| 6,764,272 B1 | 7/2004 | Nuxoll | |
| 8,240,649 B2 | 8/2012 | Kim | |
| 8,820,728 B2 | 9/2014 | Huang | |
| 2005/0000453 A1* | 1/2005 | Hwang | H01L 21/68764 118/728 |

(Continued)

FOREIGN PATENT DOCUMENTS

| | | |
|---|---|---|
| CN | 102242353 A | 11/2011 |
| JP | 2006049359 A | 2/2006 |

(Continued)

OTHER PUBLICATIONS

International Search Report and Written Opinion dated Sep. 28, 2017 for PCT Application No. PCT/US2017/041093.

*Primary Examiner* — Mahdi H Nejad
(74) *Attorney, Agent, or Firm* — Moser Taboada

(57) ABSTRACT

Embodiments of substrate carriers and method of making the same are provided herein. In some embodiments, a substrate carrier includes a substantially planar body formed of an upper layer stacked on a lower layer; and a plurality of pockets formed in the substantially planar body each of which includes a support surface surrounding the pocket for supporting a substrate.

12 Claims, 5 Drawing Sheets

(56) References Cited

U.S. PATENT DOCUMENTS

| | | | |
|---|---|---|---|
| 2005/0092255 A1* | 5/2005 | Chang | H01L 21/68728 118/728 |
| 2005/0126314 A1 | 6/2005 | Hirate | |
| 2007/0217119 A1 | 9/2007 | Johnson | |
| 2008/0064184 A1 | 3/2008 | Lackner | |
| 2008/0142733 A1 | 6/2008 | Zywno | |
| 2008/0149590 A1 | 6/2008 | Maeda | |
| 2008/0203636 A1 | 8/2008 | Schenck | |
| 2010/0111651 A1 | 5/2010 | Dawson | |
| 2010/0136795 A1 | 6/2010 | Honma | |
| 2011/0140334 A1 | 6/2011 | Zuniga | |
| 2011/0272709 A1* | 11/2011 | Hanawa | H01L 21/67115 257/77 |
| 2012/0006489 A1* | 1/2012 | Okita | H01L 21/67757 156/345.43 |
| 2012/0073976 A1 | 3/2012 | Chen et al. | |
| 2012/0156374 A1 | 6/2012 | Gurary et al. | |
| 2012/0227667 A1 | 9/2012 | Huang et al. | |
| 2012/0234229 A1* | 9/2012 | Nguyen | C23C 16/4583 117/88 |
| 2013/0109810 A1 | 5/2013 | Xie | |
| 2014/0158198 A1 | 6/2014 | Simovski | |
| 2014/0235071 A1 | 8/2014 | Cheng | |
| 2015/0108506 A1 | 4/2015 | Zhang | |
| 2015/0332952 A1 | 11/2015 | Priewasser | |
| 2016/0042923 A1 | 2/2016 | Suh | |
| 2017/0260624 A1 | 9/2017 | Sufan et al. | |
| 2021/0225688 A1* | 7/2021 | Goodman | H01L 21/0262 |
| 2021/0375663 A1* | 12/2021 | Ikejiri | C23C 16/4584 |

FOREIGN PATENT DOCUMENTS

| | | |
|---|---|---|
| JP | 2006-080445 A | 3/2006 |
| JP | 2010272550 A | 12/2010 |
| JP | 2011-35369 | 2/2011 |
| JP | 2011-114178 | 6/2011 |
| JP | 2013-143518 | 7/2013 |
| KR | 10-1452463 B1 | 10/2014 |
| WO | WO 2013/012210 A2 | 1/2013 |
| WO | WO 2014/114927 A1 | 7/2014 |

* cited by examiner

SUBSTRATE CARRIER

CROSS-REFERENCE TO RELATED APPLICATIONS

This application is a divisional of co-pending U.S. patent application Ser. No. 15/643,855, filed Jul. 7, 2017, which claims benefit of U.S. provisional patent application Ser. No. 62/360,331, filed Jul. 9, 2016. Each of the aforementioned related patent applications is herein incorporated by reference in its entirety.

FIELD

Embodiments of the present disclosure generally relate to substrate processing equipment.

BACKGROUND

Substrates to be processed are transferred to different chambers and areas using carriers that enable the transfer of multiple substrates at a time. One such carrier used in aluminum nitride deposition for light emitting diode (LED) applications, in which substrates between 2-6 inches are used, is a 300 mm silicon wafer carrier. The silicon wafer carrier is formed of single crystal silicon that is machined with pockets to carry the substrates. However, silicon wafer carriers tend to break during processing, cleaning, and/or refurbishment. Alternatively, silicon carbide (SiC) wafer carriers may be used since a SiC wafer is about 40% more dense than a silicon wafer. However, because of the increased density, SiC wafers are heavier and can, therefore, damage a substrate support on which they are placed. SiC wafer carriers can also break due to stresses in the carrier resulting from the pocket formation.

Accordingly, the inventors have provided embodiments of improved substrate carriers as disclosed herein.

SUMMARY

Embodiments of substrate carriers and method of making the same are provided herein. In some embodiments, a substrate carrier includes a substantially planar body; and a plurality of holding elements arranged on a surface of the body, wherein the plurality of holding elements are configured to hold a plurality of substrates on the surface of the body, and wherein the plurality of holding elements includes at least three holding elements disposed around a corresponding position of each of the plurality of substrates.

In some embodiments, substrate carrier includes a substantially planar body formed of an upper layer stacked on a lower layer; and a plurality of pockets formed in the substantially planar body each of which includes a support surface surrounding the pocket for supporting a substrate.

In some embodiments, a substrate carrier includes a substantially planar body formed of a molybdenum layer stacked on a silicon carbide layer; and a plurality of pockets formed in the substantially planar body each of which includes a support surface surrounding the pocket for supporting a substrate, wherein the silicon carbide layer includes two or more holes formed through the silicon carbide layer, and wherein the molybdenum layer includes two or more corresponding protrusions extending from a lower surface of the molybdenum layer into the two or more holes.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
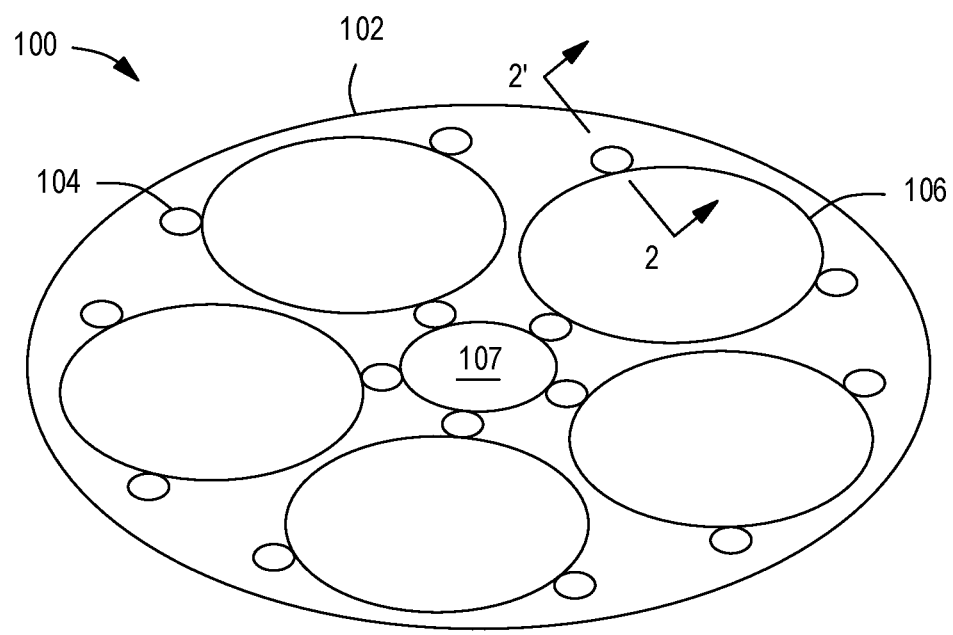
FIG. 1 depicts a schematic isometric view of a substrate carrier in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of substrate carriers are provided herein. The inventive substrate carrier advantageously reduces or eliminates stresses associated with forming pockets in a substrate carrier by placing or forming holding elements on the surface of a substrate carrier that has no pockets.

FIG. 1 illustrates a substrate carrier 100 in accordance with some embodiments of the present disclosure. In some embodiments, the substrate carrier 100 includes a substantially planar body 102 and a plurality of holding elements 104 arranged on a surface of the body 102 to hold one or more substrates 106, 107 (shown in phantom) on the surface. In some embodiments, the body 102 may be formed of silicon, silicon carbide, or molybdenum. The body 102 may have a thickness between about 750 microns to about 1,000 microns. In some embodiments, the body 102 may have a diameter of about 300 mm, although other diameters may also be used. The plurality of holding elements 104 prevent motion of the substrates 106, 107 in a direction substantially parallel to the surface of the body 102. At least three holding elements 104 are disposed around each substrate position to ensure that the substrate 106, 107 is sufficiently held in place.

The positions of the holding elements 104 depend on the size of the substrates 106, 107 to be carried on the substrate carrier 100. For example, the holding elements 104 may be arranged to accommodate substrates having a diameter between about 2 inches to about 6 inches for a substrate carrier having a body 102 with a 300 mm diameter. In the example depicted in FIG. 1, the substrate carrier 100 may be configured to hold five first substrates 106 having a diameter between about 4 inches and 6 inches in a circular array and a second substrate 107 having a diameter between about 2 inches and 4 inches at the center of the body 102. The holding elements may either be formed or coupled to the body 102 of the substrate carrier 100.

Figure 2:
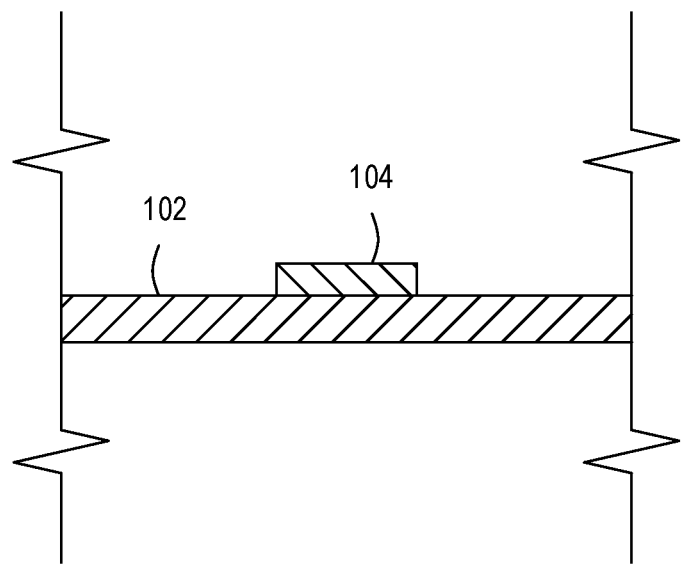
FIG. 2 depicts a cross-sectional view of the substrate carrier of FIG. 1 taken along line 2-2' in accordance with some embodiments of the present disclosure.

FIG. 2 illustrates a cross-section taken along line 2-2' in FIG. 1 in accordance with some embodiments of the present disclosure. In some embodiments, the holding element 104 is coupled to the body 102. In some embodiments, a wafer is cut into a plurality of pieces, each of which is used as the holding element 104. In some embodiments, the holding elements are formed from the same material as the body 102. In some embodiments, the holding elements are formed from a different material as the body 102. In some embodiments, to facilitate the coupling of each cut piece to the body 102, the holding elements 104 are arranged on the surface of the body 102 as desired (i.e., to support a plurality of substrates as described herein) and then heated at a predetermined temperature of about 500° C. to about 1000° C. for a period of about 10 minutes to about 240 minutes to diffusion bond the holding elements 104 to the body 102. In some embodiments, the period of time is about 120 minutes.

In some embodiments, each holding element 104 has a thickness between about 300 microns to about 500 microns. In some embodiments, each holding element 104 is either square or rectangular having a first side between about 2 mm to about 15 mm and a second side between about 2 mm and about 15 mm. In some embodiments, each holding element 104 is either square or rectangular having a first side between about 5 mm to about 10 mm and a second side between about 5 mm and about 10 mm. In some embodiments, each holding element may be circular with a diameter between about 2 mm and about 15 mm. In some embodiments, each holding element may be circular with a diameter between about 5 mm and about 10 mm.

Alternatively or in combination, at least some of the holding elements 104 may be formed on the surface of the body 102. For example, the holding elements 104 may be plasma sprayed onto the surface of the body 102 using a mask to form the plurality of holding elements 104 at desired positions. The material that is sprayed onto the body 102 to form the plurality of holding elements 104 is a material that can be sprayed with relative ease, sufficiently adheres to the surface of the body 102, has a coefficient of thermal expansion similar to a material that will be deposited on substrates placed on the substrate carrier 100 during processing, and is resistant to cleaning/refurbishment. In some embodiments, the spray material may be silicon, molybdenum, aluminum, an oxide, or the like. For example, in the embodiment in which the body 102 is formed of silicon, the spray material may be molybdenum because molybdenum adheres to silicon better than a silicon spray material. In some embodiments, the thickness of the spray coating may be about 250 microns to about 500 microns.

In some embodiments, the holding elements 104 may be three-dimensionally (3D) printed onto the surface of the body 102. In such an embodiment, the surface of the body 102 corresponding to the desired positions of the holding elements 104 are roughened prior to 3D printing to improve adhesion of the 3D printed material to the body 102. In some embodiments, for example, the desired positions may be roughened using a potassium hydroxide (KOH) caustic solution.

Figure 3:
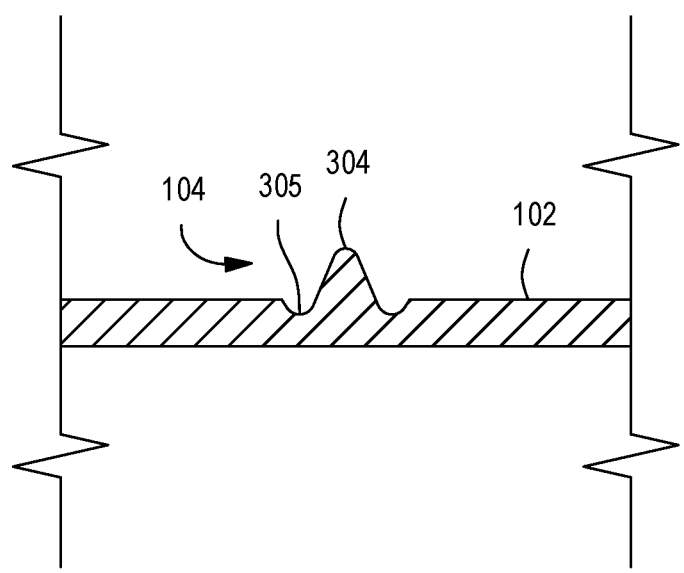
FIG. 3 depicts a cross-sectional view of the substrate carrier of FIG. 1 taken along line 2-2' in accordance with some embodiments of the present disclosure.

FIG. 3 illustrates a cross-section taken along line 2-2' in FIG. 1 in accordance with some embodiments of the present disclosure. In the embodiment illustrated in FIG. 3, each holding element 104 is formed in the surface of the body 102. For example, an electron beam or laser can be used to create a bump 304 in the surface of the body 102 to form each holding element 104. To do so, material is removed (e.g., melted) from a region 305 surrounding the position of the bump to create the bump 304. As a result, the region 305 includes a recess from which material was removed. In some embodiments, each bump has a thickness of about 1 mm to about 10 mm, or about 2 mm. In some embodiments, each bump has a height of about 200 microns to about 500 microns above the surface of the body 102.

Figure 4A:
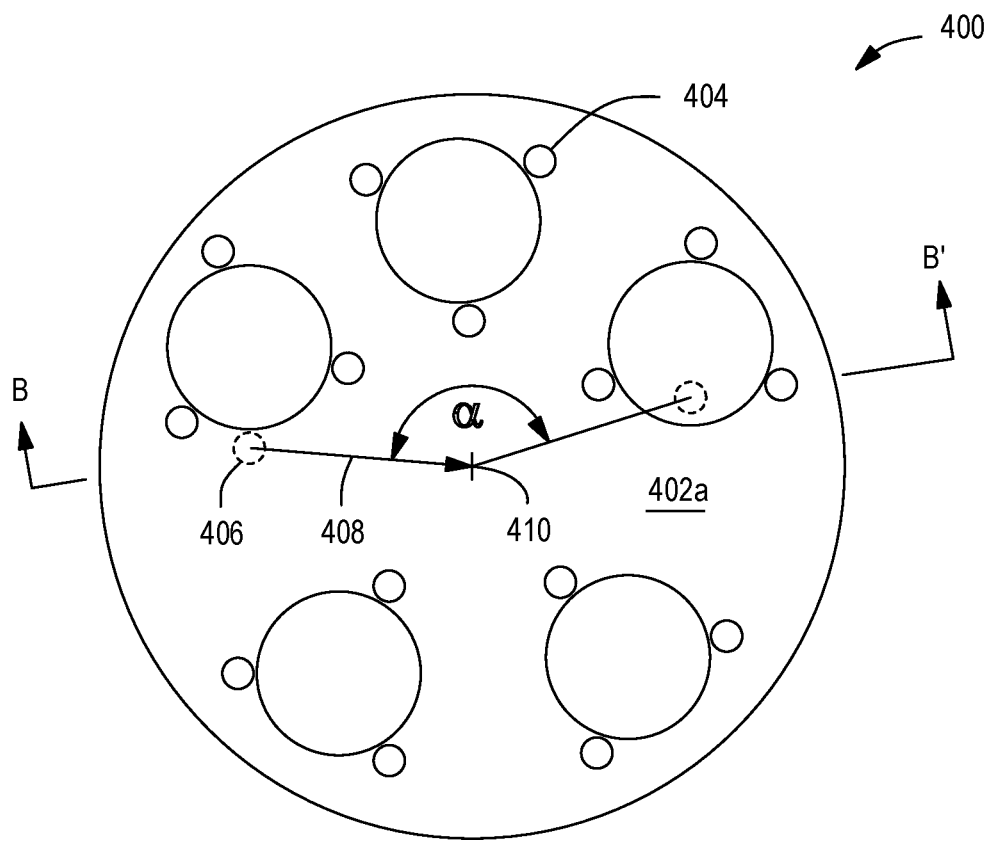
FIG. 4A depicts a schematic top view of a substrate carrier in accordance with some embodiments of the present disclosure.
Figure 4B:
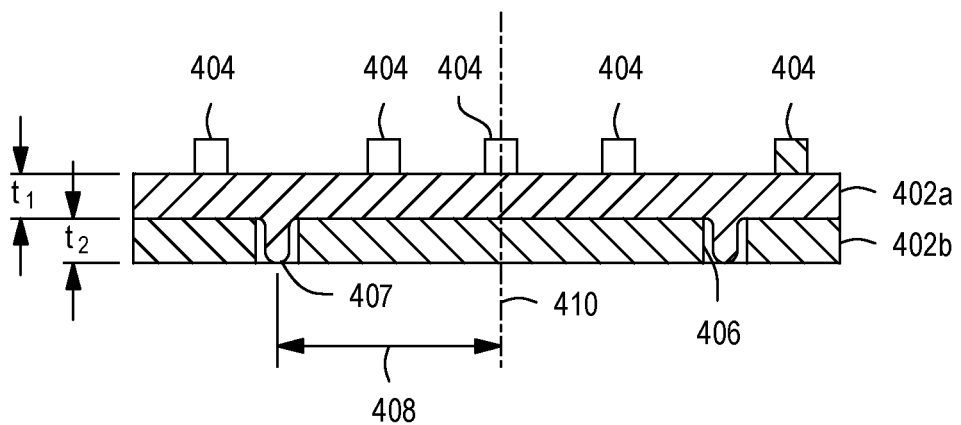
FIG. 4B depicts a cross-sectional view of the substrate carrier of FIG. 4A taken along line B-B'.

The following description will be made with reference to FIGS. 4A-4B. FIG. 4A depicts a schematic top view of a substrate carrier in accordance with some embodiments of the present disclosure. FIG. 4B depicts a cross-sectional view of the substrate carrier of FIG. 4A taken along line B-B'. In some embodiments, a substrate carrier 400 having a plurality of holding elements 404 may be formed of two stacked layers 402a,b to improve the rigidity of the substrate carrier 400. For example, in some embodiments, an upper layer 402a formed of molybdenum and having a first thickness $t_1$ may be stacked on a lower layer 402b formed of silicon carbide and having a second thickness $t_2$. In some embodiments, the first thickness $t_1$ may be between about 0.2 mm and about 0.5 mm and the second thickness $t_2$ may be less than or equal to about 1.5 mm. In some embodiments, the total weight of the substrate carrier 400 may be less than about 250 grams.

In some embodiments, the two layers may be configured to prevent relative movement of the two layers and ensure the proper relative orientation of the two layers during stacking. For example, in some embodiments, the lower layer 402b may include two or more holes 406 (two shown) disposed a first distance 408 from the center 410 of the substrate carrier 400 at a predetermined angle α with respect to one another. In embodiments where the substrate carrier has a diameter of about 300 mm, the first distance 408 may be about 75 mm. In some embodiments, the predetermined angle α may be between about 90 degrees and about 180 degrees with respect to each other. In some embodiments, the predetermined angle α may be about 175 degrees. The upper layer 402a may include two or more corresponding protrusions 407 extending from the lower surface of the upper layer 402a at positions corresponding to the two or more holes 406 so that when the upper layer 402a is stacked on the lower layer 402b, the protrusions 407 extend into the holes 406 to correctly position the two layers 402a,b with respect to each other and prevent relative movement of the two layers 402a,b.

Figure 5A:
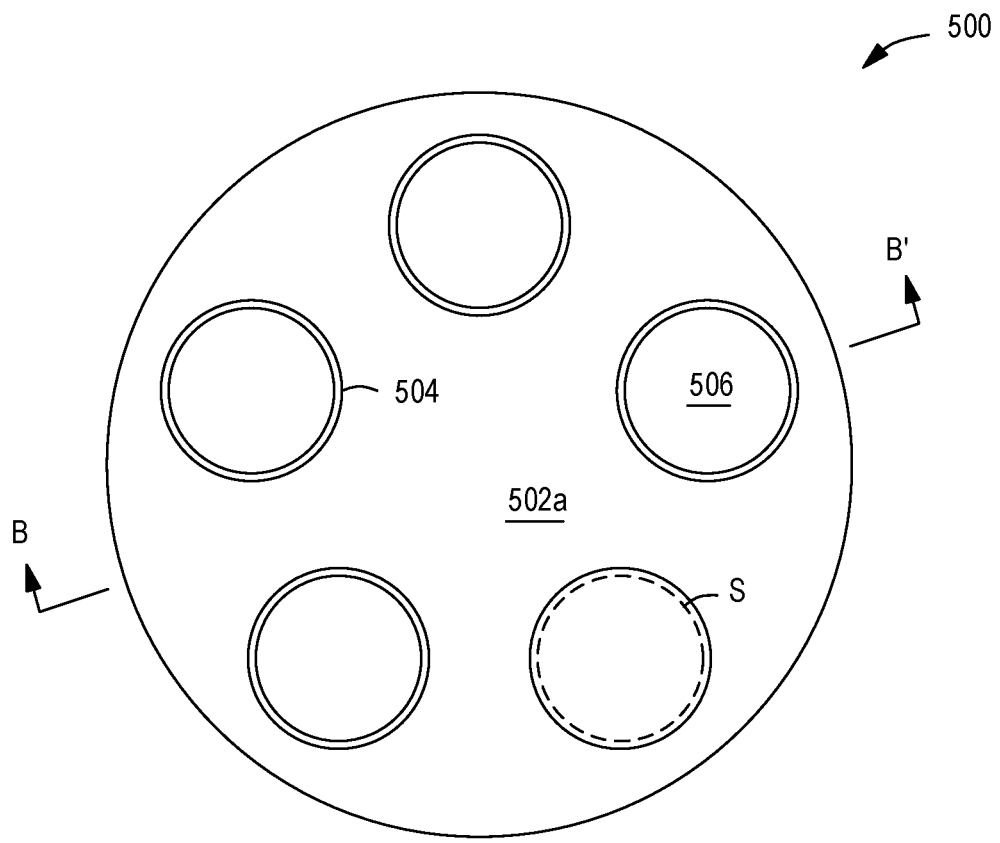
FIG. 5A depicts a schematic top view of a substrate carrier in accordance with some embodiments of the present disclosure.
Figure 5B:
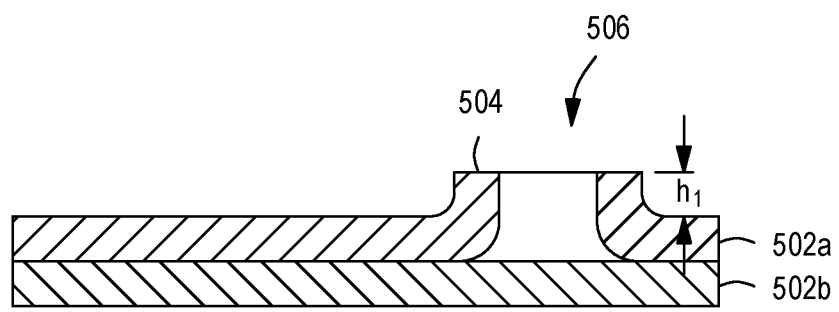
FIG. 5B depicts a cross-sectional view of the substrate carrier of FIG. 5A taken along line B-B'.

The following description will be made with reference to FIGS. 5A-5B. FIG. 5A depicts a schematic top view of a substrate carrier in accordance with some embodiments of the present disclosure. FIG. 5B depicts a cross-sectional view of the substrate carrier of FIG. 5A taken along line B-B'. In some embodiments, a substrate carrier 500 is formed of an upper layer 502a stacked on a lower layer 502b, as described above with respect to the substrate carrier 400. As such, the description of the layers and the coupling of the two layers will not be described here or shown in FIGS. 5A-5B for clarity. However, the layers of substrate carrier 500 may be configured similarly to those of the substrate carrier 400.

In some embodiments, the substrate carrier 500 includes a plurality of pockets 506 (five shown), each of which is defined by a rim 504 that extends upward to define a support surface for supporting a substrate. The rim 504 is formed by forming a hole in the upper layer 502a and bending the portion of the upper layer 502a immediately adjacent the hole upwards. An outer diameter of the resulting rim 504 is about the same as the diameter of a substrate S (shown in phantom in FIG. 5A) to be placed atop the rim 504. In some embodiments, the hole that is originally formed in the upper layer 502a may be sized so that the resulting outer diameter of the rim is about 4 inches. The height $h_1$ of the rim 504 above an upper surface of the upper layer 502a is between about 0.5 mm and about 1 mm. In some embodiments, the substrate carrier 500 may additionally include holder elements similar to those described above with respect to FIGS. 1-4B to prevent radial movement of a substrate disposed above the rim 504.

Figure 6A:
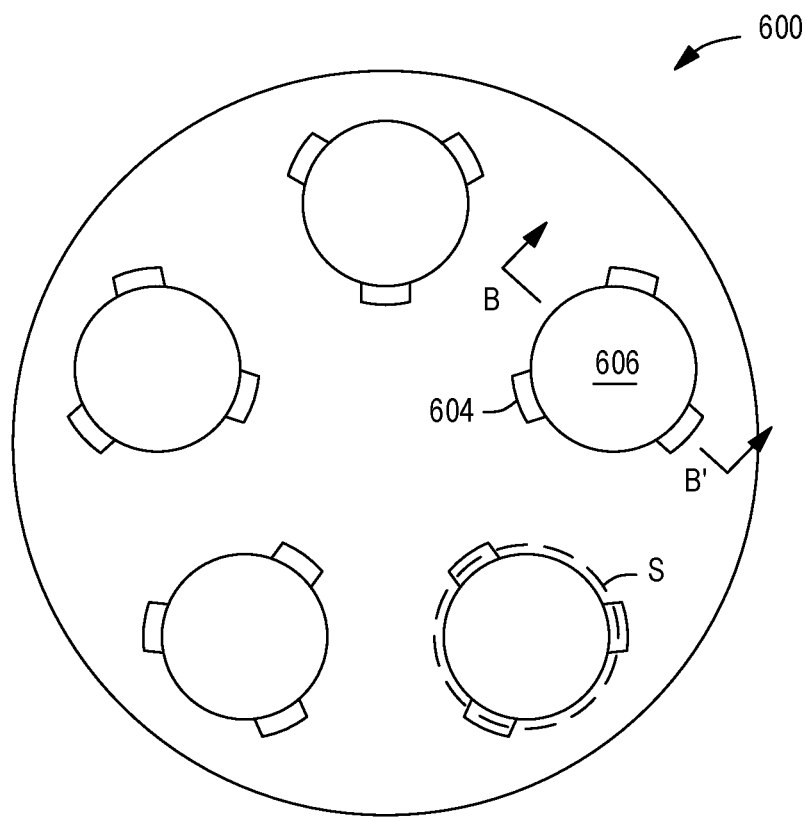
FIG. 6A depicts a schematic top view of a substrate carrier in accordance with some embodiments of the present disclosure.
Figure 6B:
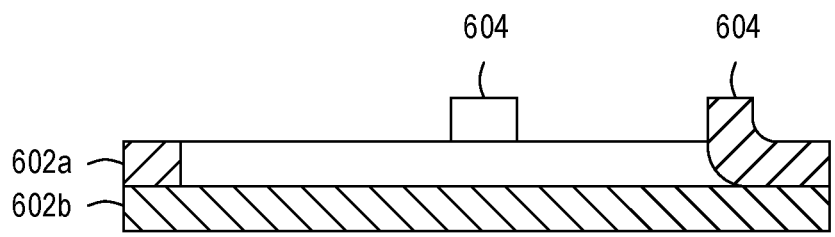
FIG. 6B depicts a cross-sectional view of the substrate carrier of FIG. 6A taken along line B-B'.

The following description will be made with reference to FIGS. 6A-6B. FIG. 6A depicts a schematic top view of a substrate carrier in accordance with some embodiments of the present disclosure. FIG. 6B depicts a cross-sectional view of the substrate carrier of FIG. 6A taken along line B-B'. In some embodiments, a substrate carrier 600 is formed of an upper layer 602a stacked on a lower layer 602b, as described above with respect to the substrate carrier 400. As such, the description of the layers and the coupling of the two layers will not be described here or shown in FIGS. 6A-6B for clarity. However, the layers of substrate carrier 600 may be configured similarly to those of the substrate carrier 400. The substrate carrier 600 is similar to the substrate carrier 500 except for the configuration of the pocket 606.

In contrast to the pocket 506 of the substrate carrier 500, the pocket 606 does not include a rim. Instead, a hole is formed through the upper layer 602a and only portions of the immediately adjacent upper layer 602a are bent upward to form a plurality of tabs 604 (three shown) which form a support surface for supporting a substrate S (shown in phantom in FIG. 6A). The plurality of tabs 604 may be disposed axisymmetrically about each pocket 606. An outer diameter of a circle circumscribing the plurality of tabs 604 is about the same as the diameter of the substrate S to be placed atop the plurality of tabs 604. In some embodiments, the substrate carrier 600 may additionally include holder elements similar to those described above with respect to FIGS. 1-4B to prevent radial movement of a substrate disposed above the plurality of tabs 604.

Although specific examples of embodiments of a substrate carrier have been described, various combinations or permutations of the embodiments disclosed may be utilized. For example, the holding elements 104 may alternatively be bead-blasted or machined out of the body 102 or in a two-layer carrier, as described above with respect to FIGS. 4A-6B. Furthermore, although the embodiments disclosed illustrate a specific number of holding elements or pockets, the inventive substrate carrier may be configured to accommodate as many substrates as desired.

While the foregoing is directed to embodiments of the present disclosure, other and further embodiments of the disclosure may be devised without departing from the basic scope thereof.

The invention claimed is:

1. A substrate carrier, comprising:
a substantially planar body formed of an upper layer stacked on a lower layer; and
a plurality of pockets formed in the substantially planar body and defined by an upper surface of the lower layer and a support surface formed by the upper layer, wherein the support surface surrounds each pocket of the plurality of pockets for supporting a substrate, wherein at least one of:
the support surface is formed by a rim defining each pocket, wherein the rim is formed by forming a hole through the upper layer and bending the upper layer immediately surrounding the hole upward, or
the support surface is formed by a plurality of tabs, wherein each of the plurality of tabs is formed by forming a hole through the upper layer and bending portions of the upper layer adjacent the hole upward.

2. The substrate carrier of claim 1, wherein the support surface is formed by the rim defining each pocket, and wherein at least one of:
an outer diameter of the rim is about 4 inches, or
a first height of the rim above an upper surface of the upper layer is between about 0.5 mm and about 1 mm.

3. The substrate carrier of claim 1, wherein the support surface defines an uppermost surface of the substrate carrier.

4. The substrate carrier of claim 1, wherein the support surface is formed by the plurality of tabs, and wherein the plurality of tabs are disposed axisymmetrically about each pocket.

5. The substrate carrier of claim 1, wherein the support surface is formed by the plurality of tabs, and wherein a circle circumscribing the plurality of tabs has a diameter of about 4 inches.

6. The substrate carrier of claim 1, comprising:
the upper layer formed of a molybdenum layer and the lower layer formed of a silicon carbide layer.

7. The substrate carrier of claim 6, wherein the plurality of pockets are five pockets.

8. The substrate carrier of claim 6, wherein the molybdenum layer has a thickness of about 0.2 mm to about 0.5 mm.

9. The substrate carrier of claim 6, wherein the silicon carbide layer has a thickness of less than or equal to about 1.5 mm.

10. The substrate carrier of claim 6, wherein the plurality of pockets are disposed axisymmetrically about a center of the substrate carrier.

11. The substrate carrier of claim 6, wherein a total weight of the substrate carrier is less than about 250 grams.

12. The substrate carrier of claim 6, wherein the silicon carbide layer includes two or more holes formed through the silicon carbide layer, and wherein the molybdenum layer includes two or more corresponding protrusions extending from a lower surface of the molybdenum layer into the two or more holes.

* * * * *